United States Patent
Huh et al.

(10) Patent No.: US 8,407,538 B2
(45) Date of Patent: Mar. 26, 2013

(54) SEMICONDUCTOR PACKAGE

(75) Inventors: Tae-Hyoung Huh, Gyeonggi-do (KR); Kwi-Dong Kim, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 149 days.

(21) Appl. No.: 12/981,628

(22) Filed: Dec. 30, 2010

(65) Prior Publication Data

US 2012/0096322 A1    Apr. 19, 2012

(30) Foreign Application Priority Data

Oct. 15, 2010    (KR) .................. 10-2010-0100672

(51) Int. Cl.
*G11C 29/00* (2006.01)
*G11C 7/00* (2006.01)

(52) U.S. Cl. .................. 714/719; 365/189.08
(58) Field of Classification Search .......... 714/718, 714/719, 763; 365/189.08
See application file for complete search history.

(56) References Cited

U.S. PATENT DOCUMENTS

2010/0078635 A1* 4/2010 Kuroda et al. .................. 257/48
2010/0107036 A1* 4/2010 Resnick ........................ 714/763

FOREIGN PATENT DOCUMENTS

| KR | 19970006223 | 4/1997 |
| KR | 1020060041870 | 5/2006 |
| KR | 1020060050604 | 5/2006 |
| KR | 1020090056259 | 6/2009 |

OTHER PUBLICATIONS

Office Action issued by the Korean Intellectual Property Office on Jan. 18, 2012.
Office Action issued by the Korean Intellectual Property Office on Aug. 29, 2012.

* cited by examiner

*Primary Examiner* — Cynthia Britt
(74) *Attorney, Agent, or Firm* — IP & T Group LLP

(57) ABSTRACT

A semiconductor package includes a memory controller chip, a plurality of first memory chips configured to store normal data, a second memory chip configured to store error information for correcting or detecting error of the normal data, and an interface unit configured to interface the memory controller chip, the plurality of first memory chips, and the second memory chip.

12 Claims, 2 Drawing Sheets

SEMICONDUCTOR PACKAGE

CROSS-REFERENCE TO RELATED APPLICATIONS

The present application claims priority of Korean Patent Application No. 10-2010-0100672, filed on Oct. 15, 2010, which is incorporated herein by reference in its entirety.

BACKGROUND OF THE INVENTION

Exemplary embodiments of the present invention relate to a semiconductor package technology, and more particularly, to a technology for correcting an error of a memory chip mounted inside a package.

The current trend of electronic industries is to fabricate a semiconductor chip in a smaller size. Technologies for downscaling the semiconductor chip include a system on chip (SOC) technology and a system in package (SIP) technology. The SOC technology is used to fabricate a plurality of semiconductor devices into a single semiconductor chip, and the SIP technology is used to package a plurality of semiconductor chips into a single semiconductor package. More specifically, the SIP technology is used to fabricate a single semiconductor package by mounting a plurality of semiconductor chips on a substrate horizontally or vertically.

In the early stages of semiconductor memory device development there were few defective cells in a memory chip after the semiconductor fabrication process. That is, a plurality of original good dies have been distributed on a wafer. However, because the capacity of semiconductor memory devices have increased, it has been difficult to fabricate a semiconductor chip having no defective cells. At present, it is rare to fabricate such a chip. To resolve such a situation, a repair method of replacing a defective cell with a redundancy memory cell has been used.

The repair is performed by storing an address of a defective cell, which is detected during a test operation, in a fuse circuit and internally replacing the defective cell with a cell corresponding to a new address. The repair is performed relatively easily at a wafer level. However, the repair is not easy at a package level, that is, after a wafer test and a repair are completed and a chip is mounted inside a package. In particular, even though no defects are detected during a wafer test, a new defect is occasionally detected after a chip is mounted inside a package. Therefore, there is a demand to repair an error which is detected or generated at a package level.

Further, it is more difficult to repair an error at the package level when a plurality of memory chips are mounted inside a single package. Therefore, there is a need for a technology which can repair an error at the package level even when a large number of chips are mounted inside a single package.

SUMMARY OF THE INVENTION

Exemplary embodiments of the present invention are directed to reduce the occurrence of a defect which is generated in a plurality of memory chips included in a package.

In accordance with an exemplary embodiment of the present invention, a semiconductor package includes a memory controller chip, a plurality of first memory chips configured to store normal data, a second memory chip configured to store error information for correcting or detecting error of the normal data, and an interface unit configured to interface the memory controller chip, the plurality of first memory chips, and the second memory chip.

Upon initialization of a write operation, the memory controller chip may perform a control operation to store the normal data in the plurality of first memory chips and to store the error information of the normal data in the second memory chip.

Upon initialization of a read operation, the memory controller chip may read the normal data from the plurality of first memory chips, reads the error information of the normal data from the second memory chip, and corrects the error of the normal data by using the error information.

In accordance with another exemplary embodiment of the present invention, a semiconductor package includes a package substrate in which balls or pins are formed toward the outside of the package, a first interpose formed on the package substrate, a memory controller chip stacked on a portion of the first interpose, and a plurality of memory chips stacked on a portion of the interpose and interfaced with the memory controller chip through the first interpose, wherein the plurality of memory chips include a plurality of first memory chips configured to store normal data, and a second memory chip configured to store error information for correcting or detecting an error of the normal data.

The semiconductor package may further include a second interpose formed between the first interpose and the plurality of stacked memory chips, and configured to interface the plurality of memory chips and the first interpose.

The second interpose may communicate with the plurality of stacked memory chips through a plurality of through-silicon vias (TSVs).

In accordance with yet another exemplary embodiment of the present invention, a semiconductor package includes a plurality of first memory chips configured to store normal data, a second memory chip configured to store error information for correcting or detecting error of the normal data, and an interface unit configured to interface the plurality of first memory chips and the second memory chip.

DESCRIPTION OF SPECIFIC EMBODIMENTS

Figure 1:
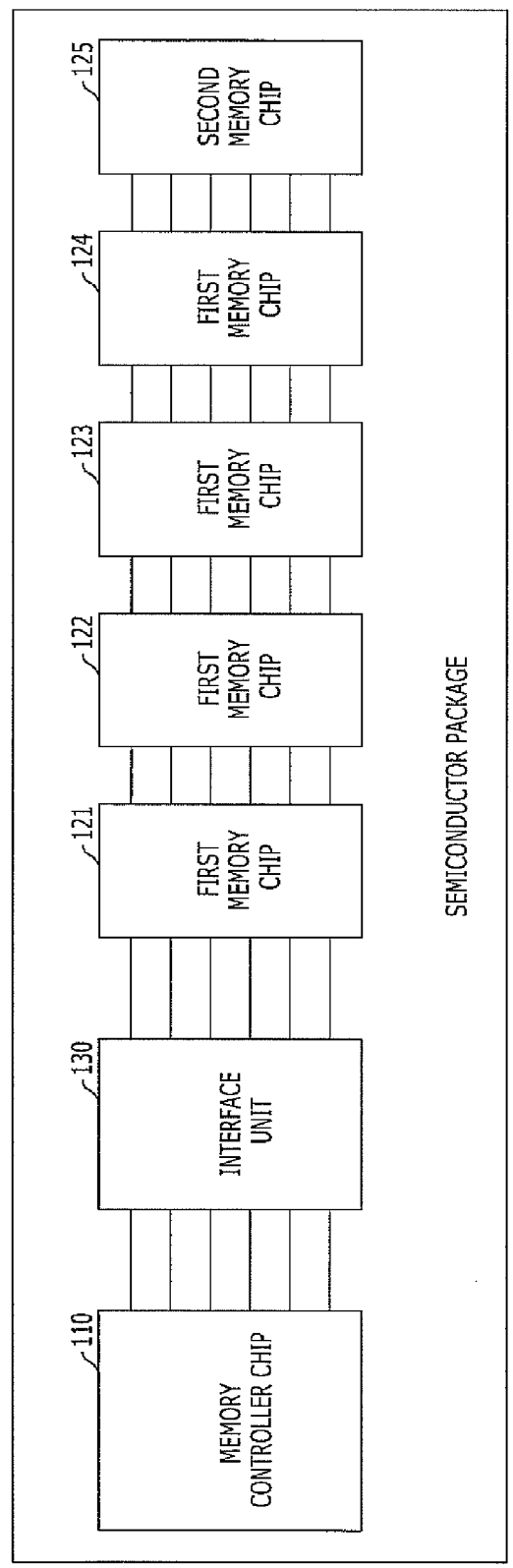
FIG. 1 is a diagram of a semiconductor package in accordance with an exemplary embodiment of the present invention.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

FIG. 1 is a diagram of a semiconductor package in accordance with an exemplary embodiment of the present invention.

Referring to FIG. 1, the semiconductor package includes a memory controller chip 110, a plurality of first memory chips 121 to 124, a second memory chip 125, and an interface unit 130. The plurality of first memory chips 121 to 124 are configured to store normal data. The second memory chip 125 is configured to store error information for correcting or detecting an error of the normal data. The interface unit 130 is configured to interface the memory controller chip 110, the plurality of first memory chips 121 to 124, and the second memory chip 125.

The error information stored in the second memory chip 125 may be a parity bit for checking whether or not the data stored in the first memory chips 121 to 124 are normal data, or an error correction code (ECC) for correcting the data when the data stored in the first memory chips 121 to 124 are abnormal. That is, the error information may be information (e.g., a parity bit) for checking the error of data, or may be information (e.g., ECC) for correcting the error of the data. For example, when an 8-bit ECC per 64-bit data is used, a 1-bit error occurring in 64 bits can be corrected.

Upon initiation of a write operation, the memory controller chip 110 applies a write command, an address, and normal data to the first memory chips 121 to 124. The first memory chips 121 to 124 store the normal data at an address designated by the applied address. The memory controller chip 110 applies a write command, an address, and error information to the second memory chip 125 so that error information corresponding to the normal data stored in the first memory chips 121 to 124 can be stored in the second memory chip 125. Then, the second memory chip 125 stores the error information at an address designated by the applied address.

Upon initiation of a read operation, the memory controller chip 110 applies a read command and an address to the first memory chips 121 to 124 and reads the data stored in the first memory chips 121 to 124. In addition, the memory controller chip 110 applies a read command and an address to the second memory chip 125, and reads the error information stored in the second memory chip 125. Using the error information read from the second memory chip 125, the memory controller chip 110 checks or corrects the error of the normal data read from the first memory chips 121 to 124.

The memory controller chip 110 may simultaneously access the first memory chips 121 to 124, or may access a part of the first memory chips 121 to 124, or may sequentially access the first memory chips 121 to 124.

While the description above explains that the memory controller chip 110 stores the error information in the second memory chip 125 and directly corrects the error of the normal data by using the error information stored in the second memory chip 125, other elements can also perform the error correction operation. For example, the interface unit 130 may perform the error correction operation. Or additional units, which are not illustrated in the drawings, may perform the error correction operation.

For example, when the memory controller chip 110 transfers the write command and the data to the interface unit 130, the interface unit 130 may generate the error information through its own operation, and may store the normal data in the first memory chips 121 to 124 and store the error information in the second memory chip 125. When the memory controller chip 110 transfers the read command to the interface unit 130, the interface unit 130 may read the normal data from the first memory chips 121 to 124 and read the error information from the second memory chip 125. Then, the interface unit 130 may correct the error of the normal data by using the error information and transfer the corrected data to the memory controller chip 110.

The function of the memory controller has recently tended to be embedded into a CPU or GPU. Therefore, the memory controller chip 110 may be a CPU or GPU.

Figure 2:
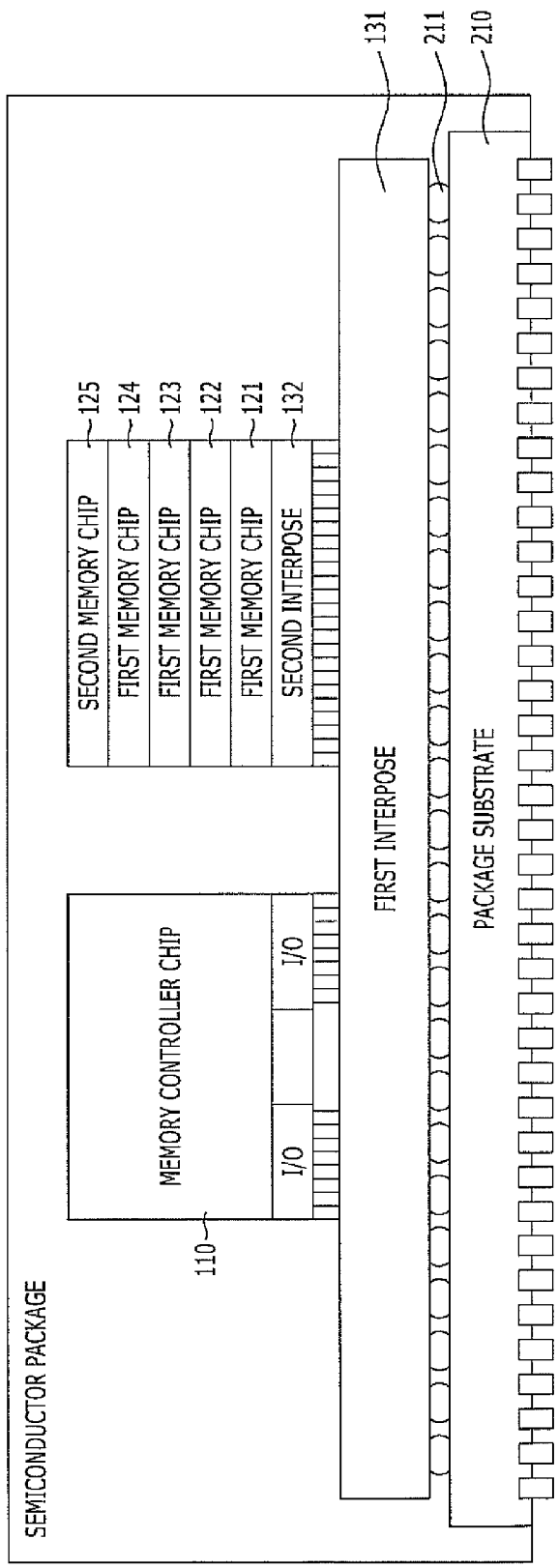
FIG. 2 is a detailed diagram of the semiconductor package illustrated in FIG. 1.

FIG. 2 is a detailed diagram of the semiconductor package illustrated in FIG. 1.

Referring to FIG. 2, the semiconductor package includes a package substrate 210 in which balls or pins are formed toward the outside of the package, a first interpose 131 formed on the package substrate 210, a memory controller chip 110 stacked on a portion of the first interpose 131, and a plurality of memory chips 121 to 125 stacked on a portion of the first interpose 131 and interfaced with the memory controller chip 110 through the first interpose 131. Among the plurality of memory chips 121 to 125, the first memory chips 121 to 124 store normal data, and the second memory chip 125 stores error information for correcting or detecting the error of the normal data.

The first interpose 131 is coupled to the package substrate 210 through microbumps 211 and manages the interface between the memory controller chip 110 and the memory chips 121 to 125. The memory chips 121 to 125 and the memory controller chip 110 communicate with one another through the first interpose 131, and the semiconductor package and external devices communicate with one another through the first interpose 131. Input/output (I/O) of the memory controller chip 110 and the first interpose 131 are coupled together, and the first interpose 131 and a second interpose 132 are coupled together.

The second interpose 132 manages the interface between the memory chips 121 to 125 and the first interpose 131. Since the memory chips 121 to 125 are stacked, through-silicon vias (TSVs) (not shown) passing through the memory chips 121 to 125 are formed. The memory chips 121 to 125 and the second interpose 132 can communicate with one another through the TSVs. As illustrated in FIG. 2, in addition to the first interpose 131, the second interpose 132 may be separately provided. However, when the first interpose 131 is designed to perform the function of the second interpose 132, the formation of the second interpose 132 may be omitted.

Since the chips included in the semiconductor package have been described above with reference to FIG. 1, a detailed description thereof will be omitted.

In accordance with the exemplary embodiments of the present invention, in addition to the plurality of first memory chips storing the normal data, the second memory chip is mounted inside the semiconductor package in order to store the error information for detecting or correcting the error of the normal data. Therefore, the error of the data can be corrected or detected using the error information.

While the present invention has been described with respect to the specific embodiments, it will be apparent to those skilled in the art that various changes and modifications may be made without departing from the spirit and scope of the invention as defined in the following claims.

Although it has been described in the above embodiment that the memory controller chip, the first memory chips, and the second memory chip are all mounted inside the semiconductor package, it should be understood that the memory controller chip may be positioned outside the semiconductor package.

What is claimed is:
1. A semiconductor package comprising:
a memory controller chip;
a plurality of first memory chips configured to store normal data;
a second memory chip configured to store error information for correcting or detecting error of the normal data; and
an interface unit configured to interface the memory controller chip, the plurality of first memory chips, and the second memory chip, wherein the memory controller chip is stacked over a first portion of the interface unit, and the plurality of first memory chips, and the second memory chip, are stacked over a second portion of the interface unit, which is different from the first portion.

2. The semiconductor package of claim 1, wherein, upon initiation of a write operation, the memory controller chip performs a control operation to store the normal data in the plurality of first memory chips and to store the error information of the normal data in the second memory chip.

3. The semiconductor package of claim 1, wherein, upon initialization of a read operation, the memory controller chip reads the normal data from the plurality of first memory chips, reads the error information of the normal data from the second memory chip, and corrects the error of the normal data by using the error information.

4. A semiconductor package comprising:
   a package substrate in which balls or pins are formed toward the outside of the package;
   a first interpose formed on the package substrate;
   a memory controller chip stacked on a first portion of the first interpose; and
   a plurality of memory chips stacked on a second portion of the first interpose, which is different from the first portion, and interfaced with the memory controller chip through the first interpose,
   wherein the plurality of memory chips comprise:
   a plurality of first memory chips configured to store normal data; and
   a second memory chip configured to store error information for correcting or detecting an error of the normal data.

5. The semiconductor package of claim 4, wherein the first interpose is coupled to the package substrate through microbumps.

6. The semiconductor package of claim 4, further comprising a second interpose formed between the first interpose and the plurality of stacked memory chips, and configured to interface the plurality of memory chips and the first interpose.

7. The semiconductor package of claim 6, wherein the second interpose communicates with the plurality of stacked memory chips through a plurality of through-silicon vias (TSVs).

8. The semiconductor package of claim 4, wherein, upon initialization of a write operation, the memory controller chip performs a control operation to store the normal data in the plurality of first memory chips and to store the error information of the normal data in the second memory chip.

9. The semiconductor package of claim 4, wherein, upon initialization of a read operation, the memory controller chip reads the normal data from the plurality of first memory chips, reads the error information of the normal data from the second memory chip, and corrects the error of the normal data by using the error information.

10. The semiconductor package of claim 4, wherein the memory controller chip comprises a GPU or a CPU.

11. A semiconductor package comprising:
    a plurality of first memory chips configured to store normal data;
    a second memory chip configured to store error information for correcting or detecting error of the normal data; and
    an interface unit configured to interface the plurality of first memory chips and the second memory chip, wherein the interface unit communicates with a memory controller chip positioned outside of the semiconductor package.

12. The semiconductor package of claim 11, wherein the plurality of first memory chips and the second memory chip are stacked, and the plurality of first memory chips and the second memory chip communicate with the interface unit through a plurality of through-silicon vias (TSVs).

\* \* \* \* \*